United States Patent [19]

Imai et al.

[11] Patent Number: 4,800,579
[45] Date of Patent: Jan. 24, 1989

[54] CHARGE TRANSFER DEVICE PROVIDED WITH CHARGE DETECTION CIRCUIT OF A FLOATING GATE SYSTEM

[75] Inventors: Shin-ichi Imai; Naoki Hosoya, both of Yokohama, Japan

[73] Assignee: Kabushiki Kaisha Toshiba, Kawasaki, Japan

[21] Appl. No.: 31,456

[22] Filed: Mar. 30, 1987

[30] Foreign Application Priority Data

Mar. 31, 1986 [JP] Japan ................................. 61-73495

[51] Int. Cl.$^4$ ...................... G11C 19/28; H01L 29/78
[52] U.S. Cl. .......................................... 377/60; 377/63
[58] Field of Search ........................ 377/58, 60, 61, 62, 377/63; 358/213.18, 213.26, 213.31, 213.29; 357/24, 24 M

[56] References Cited

U.S. PATENT DOCUMENTS

| | | | |
|---|---|---|---|
| 3,987,312 | 10/1976 | Ablassmeier | 357/24 |
| 4,091,278 | 5/1978 | Tchon | 357/24 |
| 4,103,343 | 7/1978 | Engeler et al. | 357/24 |
| 4,177,391 | 12/1979 | Sunami et al. | 357/24 |
| 4,266,146 | 5/1981 | Van Roermund | 357/24 |

FOREIGN PATENT DOCUMENTS 1566947  5/1980  United Kingdom .

*Primary Examiner*—John S. Heyman
*Assistant Examiner*—Tai van Duong
*Attorney, Agent, or Firm*—Foley & Lardner, Schwartz, Jeffery, Schwaab, Mack, Blumenthal & Evans

[57] ABSTRACT

This device comprises transfer electrodes and read electrodes. The read electrode operates in accordance with two modes. Where it operates based on the charge detection mode, a charge below the read electrode is read out in accordance with the floating gate system, so that a charge detection signal is produced. On the other hand, where it operates based on the charge transfer mode, the read electrode performs a function equivalent to the transfer electrode. This device further comprises selector means, thus permitting the read electrode to select either of two modes to operate in a selected mode.

5 Claims, 6 Drawing Sheets

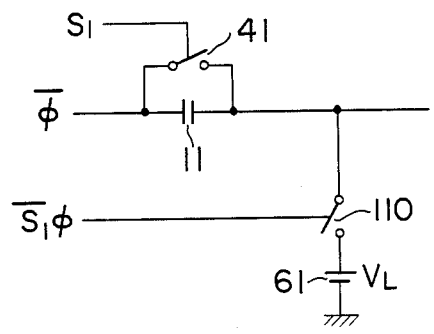
FIG. 11
FIG. 12
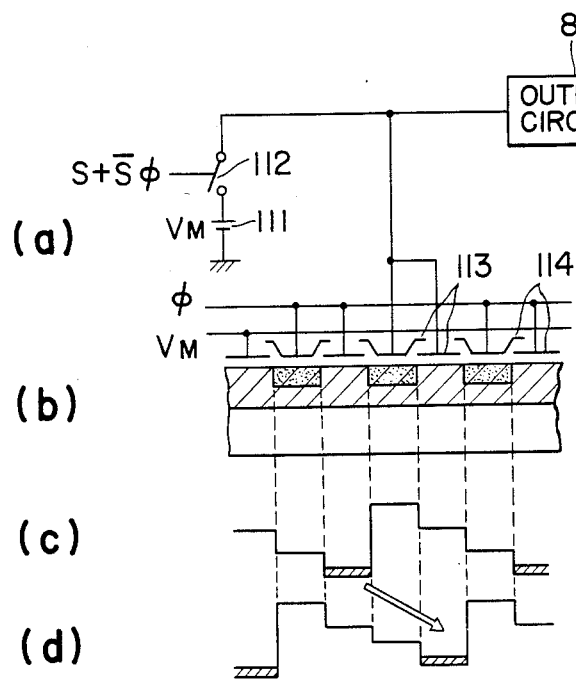
FIG. 13
FIG. 14

CHARGE TRANSFER DEVICE PROVIDED WITH CHARGE DETECTION CIRCUIT OF A FLOATING GATE SYSTEM

BACKGROUND OF THE INVENTION

The present invention relates to a charge transfer device, and more particularly to a charge transfer device provided with a charge detection circuit of floating gate system.

For the charge detection at the output stage of a charge transfer device (which will be called "CTD" hereinafter), the floating diffusion system or the floating gate system is ordinarily employed. The floating diffusion system advantageously provides a large voltage gain at the output stage of the CTD, but has the drawback that signal charges are broken at the time of detection, thus making it impossible to successively transfer the charge which has been detected once. Contrary to this, while the drawback with the floating gate system is that step-up capacitor is generally required because transfer without loss to the subsequent stage is conducted, thus making it difficult to ensure the voltage gain as compared to the floating diffusion system, the advantage therewith is that because nondestructive charge detection is possible signals can be detected from several portions in the middle of the transfer unit.

However, CTDs using such a floating gate system give rise to the problem that signals detected through floating gates are caused to interfere with other signals, resulting in occurrence of crosstalk. This comes into question particularly in the case where floating gates are provided at a plurality of portions of the transfer path to conduct charge detection therefrom. This is because crosstalk occurs between detection signals from the plurality of portions. In addition, CTDs using the floating gate system and the floating diffusion system in combination also give rise to the problem that crosstalk occurs between detection signals based on the respective systems.

SUMMARY OF THE INVENTION

With the above in view, an object of the present invention is to provide a CTD which can eliminate crosstalk based on the charge detection signal.

The feature of the present invention resides in a charge transfer device comprising a charge transfer path, a plurality of transfer electrodes provided on the charge transfer path, a read electrode provided on the charge transfer path, clock means for delivering a clock signal to the transfer electrodes to carry out transfer on the charge transfer path, detector means for detecting signal components of a charge below the read electrode without affecting a charge transferred on the charge transfer path, transfer means for delivering a predetermined signal to the read electrode to cause the charge below the read electrode to be transferred, and selector means for allowing only one of either the detector means or the transfer means to be operative for the read electrode, thus permitting suppression of crosstalk based on a detection signal obtained from the detector means.

BRIEF DESCRIPTION OF THE DRAWINGS

FIG. 11 is a circuit diagram showing a partially modified embodiment of the circuit shown in FIG. 6(a);

FIG. 12 shows an operational function Table when the circuit shown in FIG. 11 is used;

FIG. 13(a) is a circuit diagram showing an embodiment in which the present invention is applied to a single-phase CTD, FIG. 13(b) is a cross sectional view of elements constituting the CTD shown in FIG. 13(a), and FIGS. 13(c) and 13(d) show the potential distribution diagrams, respectively; and FIG. 14 shows an operational function Table when the circuit shown in FIG. 13(a) is used.

DETAILED DESCRIPTION OF PREFERRED EMBODIMENTS

Figure 1:
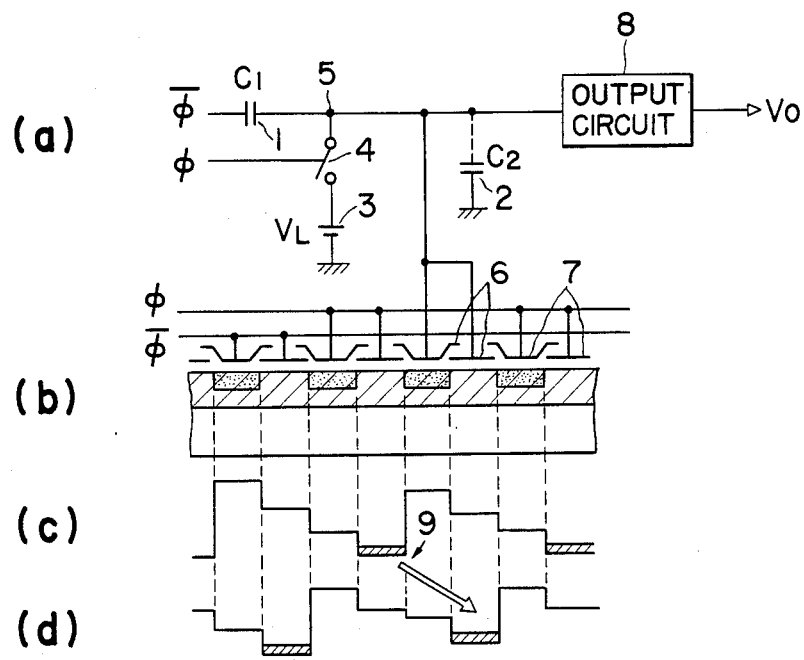
FIG. 1(a) is a simplified circuit diagram showing a typical floating gate charge detection unit.
FIG. 1(b) is a cross sectional view of elements constituting the detection unit shown in FIG. 1(a), and FIGS. 1(c) and 1(d) show the potential distribution diagrams, respectively.
Figure 2:
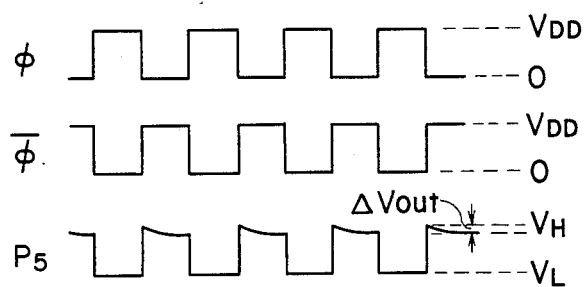
FIG. 2 shows clock waveforms used in the device shown in FIG. 1.

The operational principle of the floating gate charge detection system of a typical CTD will be first described with reference to FIGS. 1 and 2. FIG. 1(a) is a simplified circuit diagram showing a floating gate charge detection unit, FIG. 1(b) is a cross sectional view of elements constituting the detection unit, FIGS. 1(c) and 1(d) show the potential distribution diagrams, respectively, and FIG. 2 shows waveforms of various clocks used in this device. In FIG. 1, charges are transferred below electrodes 6 and 7. Initially, when a transfer clock $\phi$ represents high level, a switch 4 is turned on, so that a voltage of $V_L$ is applied from a reference voltage source 3 to a step-up capacitor 1. Thus, the floating gate electrode 6 is reset to $V_L$. At this time, the potential distribution below the electrodes 6 and 7 is as shown in FIG. 1(c). Then, when the transfer clock $\phi$ becomes low level, the switch 4 is turned off, whereby a junction 5 is in the floating state. Simultaneously with this, a voltage appearing on the junction 5 is increased to $V_H$ by the step-up capacitor 1. Accordingly, a voltage across the electrode 6 is increased to $V_H$. Thus, the potential distribution therebelow is changed as shown in FIG. 1(d), so that a charge 9 is transferred as indicated by an arrow. Namely, a potential $P_5$ appearing on the junction 5 varies in synchronism with clocks $\phi$ and $\bar{\phi}$ as indicated by FIG. 2. In this instance, a voltage $\Delta V_{out}$ is a potential change proportional to the charge 9 transferred. This voltage $\Delta V_{out}$ is detected at an output circuit 8. The upper limit $V_H$ of the potential $P_5$ is expressed as follows:

$$V_H = \frac{V_{DD}}{1 + \frac{C_2}{C_1}} + V_L$$

where $V_{DD}$ represents a power supply voltage for clocks $\phi$ and $\bar{\phi}$, $C_2$ a capacitance of the parasitic capacitor 2 of the circuit wiring etc., $C_1$ a capacitance of the step-up capacitor 1, and $V_L$ a reference voltage delivered from the reference voltage source 3.

The voltage gain G of the floating gate charge detection circuit is expressed as follows:

$$G = C_{IN}/(C_1 + C_2)$$

where $C_{IN}$ represents an input capacitance of the CTD. As stated above, since the step-up capacitance $C_1$ is added in addition to the parasitic capacitance $C_2$ in the detection circuit of the floating gate system, the voltage gain becomes small.

While the voltage gain becomes small in the floating gate charge detection system, it can provide the above-described advantage that a desired number of non-destructive charge detections are realized from the middle portions of the transfer unit.

FIG. 3(a) is a circuit diagram showing a CTD provided with two charge detection units 2 each shown in FIG. 1(a), FIG. 3(b) is a cross sectional view of elements constituting the CTD, and FIGS. 3(c) and 3(d) show the potential distribution diagrams, respectively.

Figure 3:
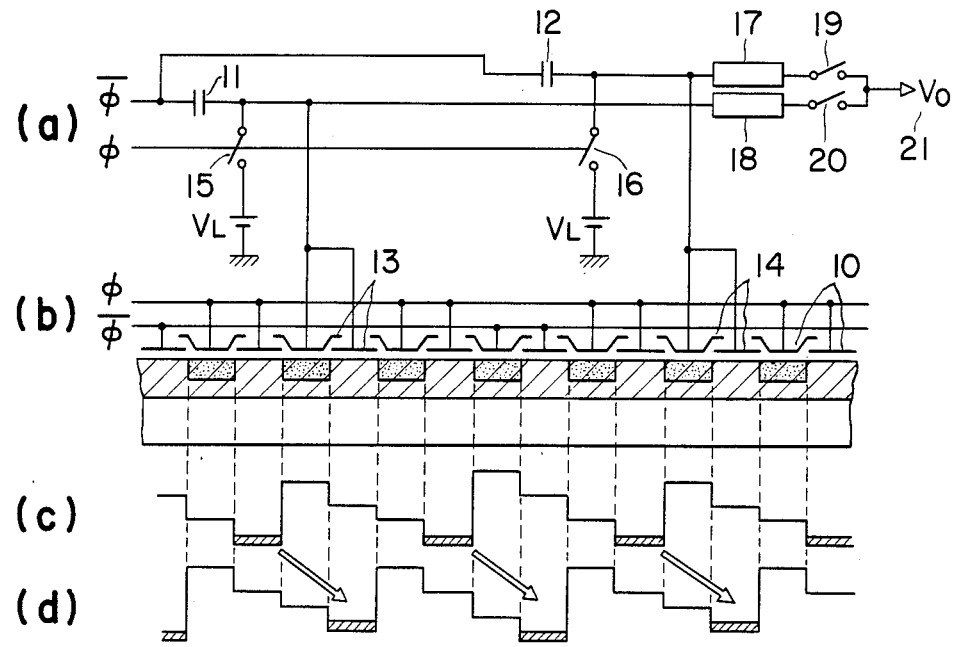
FIG. 3(a) is a circuit diagram showing a CTD of a typical floating gate charge detection system which effects charge detection from two portions.
FIG. 3(b) is a cross sectional view of elements constituting the CTD shown in FIG. 3(a), and FIGS. 3(c) and 3(d) show the potential distribution diagrams, respectively.

In FIG. 3, charges are transferred below the electrodes 10, 13 and 14. On floating gate electrodes 13 and 14, signals having a time difference therebetween are induced as voltage changes proportional to charges transferred. The induced voltages are detected by output circuit 17 and 18. Either of signals on the floating gate electrodes 13 and 14 is selected by switches 19 and 20. The signal thus selected is output as an output signal $V_0$. However, the CTD thus configured gives rise to the problem that crosstalk would occur as stated above. For instance, in the circuit shown in FIG. 3, signals having been detected by both the floating gate electrodes 13 and 14 will be transmitted by the time they have just reached the switches 19 and 20. Namely, since these two signals are transmitted on the same substrate, they interfere with each other, giving rise to a phenomenon called crosstalk such that one signal component is superimposed on the other signal as a noise. This is because both the signal transmission systems are capacitively coupled by drain-source capacitance of an element such as MOS FET, etc. constituting the circuit, capacitance through the substrate and the like. As just described above, with the device shown in FIG. 3, there occurs crosstalk phenomenon such that a non-selected signal is superimposed on a selected signal as a noise, and it is difficult to suppress noise components due to the non-selected signal to be below a predetermined value (for example, less than $-60$ dB). Accordingly, in the case of processing video signals, etc., there occurs the problem that crosstalk components will appear on the screen.

Figure 4:
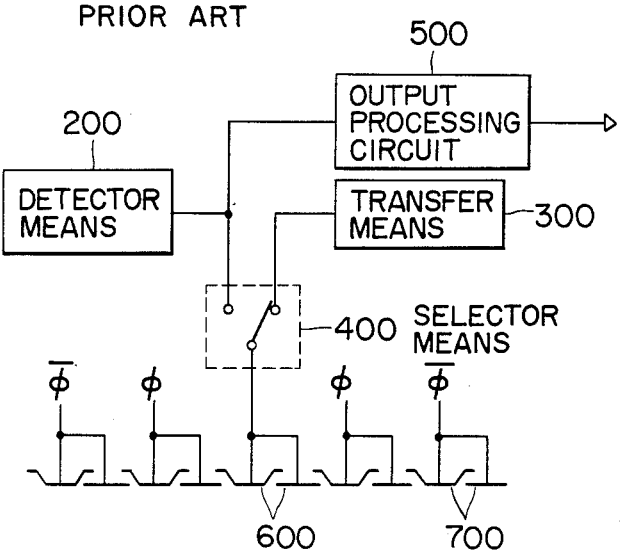
FIG. 4 is a block diagram for explaining the principle of the present invention.

The principle of the invention will be now described. FIG. 4 is a block diagram showing the principle of the invention. In FIG. 4, a read electrode 600 is formed between transfer electrodes 700. An arrangement in this figure includes a detector means 200 capable of detecting, in a non-destructive manner, a potential change due to charges stored below the read electrode 600 when the read electrode 600 is in floating condition, and a transfer means 300 capable of applying a voltage or a pulse such that a potential can be formed below the electrode with the read electrode 600 being as one transfer electrode alone. These means 200 and 300 are connected to the read electrode 600. Either the detector means 200 or the transfer means 300 is selected by selector means 400 according to need. Namely, the read electrode 600 is set to either the transfer mode or the charge detection mode by the selector means 400. Thus, only when the electrode 600 is in the charge detection mode, a detection signal is delivered to an output processing circuit 500.

Figure 5:
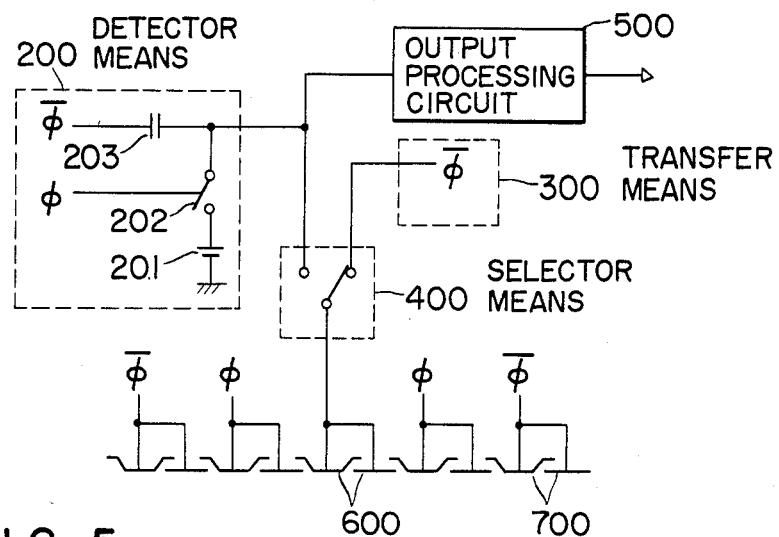
FIG. 5 is a schematic view illustrating an embodiment of the present invention in which the block shown in FIG. 4 is constituted with actual elements.

FIG. 5 is a circuit diagram showing an embodiment in which the block in FIG. 4 is constituted with actual components. The detector means 200 is composed of a reference power source 201, a switch 202 and step-up capacitor 203. The transfer means 300 is comprised of a supply source for transfer clock $\bar{\phi}$. It is seen that when the selector means 400 selects the detector means 200, the device effects the same operation as that of the device shown in FIG. 1, whereby a detection signal is delivered to the output circuit 500. It is also seen that when the selector means 400 selects the transfer means 300, the electrode 600 serves as solely one transfer electrode.

Figure 6:
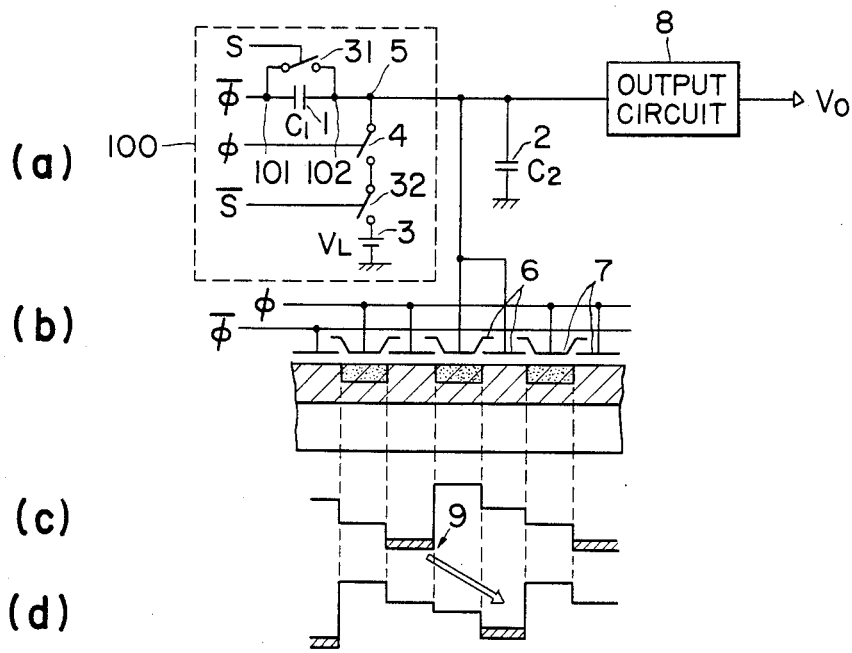
FIG. 6(a) is a circuit diagram showing a CTD according to another embodiment of the present invention.
FIG. 6(b) is a cross sectional view of elements constituting the CTD shown in FIG. 6(a), and FIGS. 6(c) and 6(d) show the potential distribution diagrams, respectively.

FIG. 6(a) is a circuit diagram showing a detection unit of a CTD according to another embodiment of the present invention, FIG. 6(b) is a cross sectional view of elements constituting the detection unit, and FIGS. 6(c) and 6(d) show the potential distribution diagrams, respectively. In this example, the circuit 100 serves as the detector means 200, the transfer means 300 and the selector means 400 which are shown in FIG. 4. When the device in FIG. 6 is compared with that in FIG. 1, the feature of this device will be clearly understood.

Namely, this device is characterized in that a switch 31 is provided in parallel with the step-up capacitor 1 in the floating gate charge detection circuit shown in FIG. 1, and in that a switch 32 is provided at a path for charging the step-up capacitor in the above detection circuit. In the embodiment shown in FIG. 6, the switch 32 is provided between the switch 4 and the reference voltage source 3. In addition, reciprocal configuration of the switches 4 and 32 may be implemented. The switch 31 is always subjected to an on-off control opposite to that for the switch 32.

The operation of this device will be now described. First, reference is made to the case where the charge detection mode is selected. In this mode, the switch 31 is in off state, whereas the switch 32 is in on state. The circuit in this condition is the same as the device in FIG. 1. A potential change proportional to the charge 9 transferred to the portion below the floating gate electrode 6 is induced. This potential change is delivered to the output processing circuit 8 and is detected thereat. Reference is now made to the case where the transfer mode is selected. In this mode, the switch 31 is in on state, whereas the switch 32 is in off state. Since the switch 31 is in on state, the transfer clock $\bar{\phi}$ is delivered to the floating gate electrode 6. Thus, this electrode 6 functions as one charge transfer electrode alone. By reciprocally controlling the switches 31 and 32 in a manner stated above, the charge detection mode and the charge transfer mode can be switched.

It is now assumed that, e.g., the detection unit shown in FIG. 6 is applied to the CTD capable of effecting both the operations of the floating gate system and the floating diffusion system. For causing this CTD to be operative on the basis of the floating gate system, it is sufficient that the switches 31 and 32 are caused to be in off and on states, respectively, thus allowing the detection unit to be operative on the basis of the charge detection mode. By providing a charge detection unit (not shown) of the floating diffusion system at the final transfer stage (the right in FIG. 6(b)), a charge detection signal is output therefrom. At this time, since no signal is output from the output circuit 8, there is no possibility that any crosstalk occurs.

Figure 7:
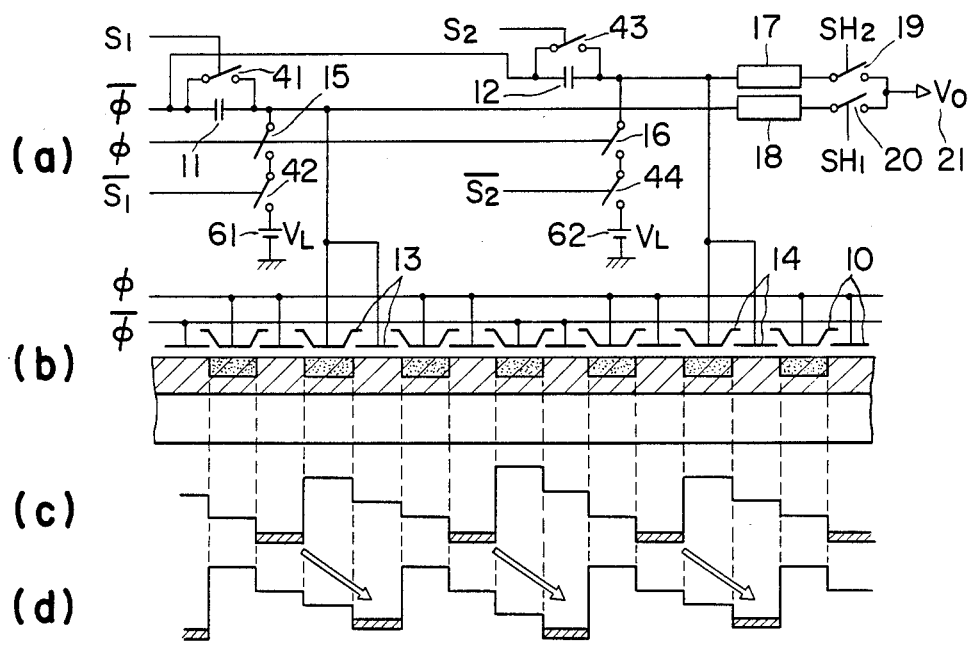
FIG. 7(a) is a circuit diagram showing a CTD according to a further embodiment of the present invention which effects charge detection from two portions.
FIG. 7(b) is a cross sectional view of elements constituting the CTD shown in FIG. 7(a), and FIGS. 7(c) and 7(d) show the potential distribution diagrams, respectively.
Figure 8:
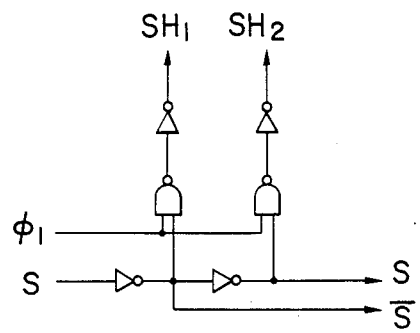
FIG. 8 is a diagrammatical view showing a logic circuit which generates clocks delivered to the circuit shown in FIG. 7(a)
Figure 9:
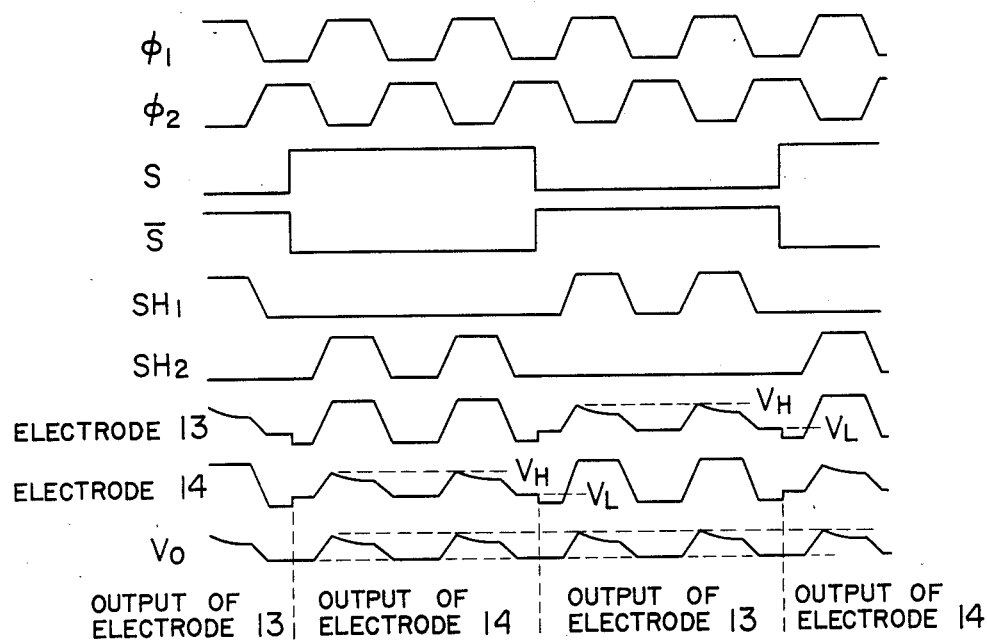
FIG. 9 is a timing chart for explaining the operation of the circuit shown in FIG. 7(a)

FIG. 7 shows an embodiment in which the present invention is applied to a device which selectively detects two signals having a time difference therebetween as shown in FIG. 3. By reciprocally controlling the switches 41 and 42, and 43 and 44 also in this embodiment, it is possible to select signals induced below the floating gate electrodes 13 and 14 to realize the charge detection. For making such a selection, it is sufficient to use a logic circuit, e.g., as shown in FIG. 8 to generate control pulses S and $\bar{S}$ and sample hold pulses SH$_1$ and SH$_2$. When such pulses are used, it is possible to set one of the floating gate electrodes 13 and 14 to the charge transfer mode, and to set the other electrode to the charge detection mode. For example, pulses S and $\bar{S}$ obtained in the logic circuit in FIG. 8 are used as follows. Namely, pulses S and $\bar{S}$ are delivered to S$_1$ of the switch 41 and $\bar{S}_1$ of the switch 42, respectively, and pulses $\bar{S}$ and S are delivered to S$_2$ of the switch 43 and $\bar{S}_2$ of the switch 44, respectively. Thus, when the pulse represents high level, the switches 41, 42, 43 and 44 are turned on, off, off and on, respectively. In addition, the floating gate electrodes 13 and 14 are brought into the charge transfer mode and the charge detection mode, respectively. At this time, since the sample hold pulse SH$_1$ shifts to low level as shown in FIG. 9, the switch 20 is turned off. The same hold pulse SH$_2$ allows the switch 19 to be in on and off states. Thus, an output signal from the output circuit 17 is placed in sample-hold condition. On the other hand, when the pulse S represents low level, the floating gate electrodes 13 and 14 are, in a manner opposite to the above operation, brought into the charge detection mode and the charge transfer mode, respectivley. In addition, the switch 19 is turned off. Thus, the sample hold is performed by the switch 20.

Figure 10:
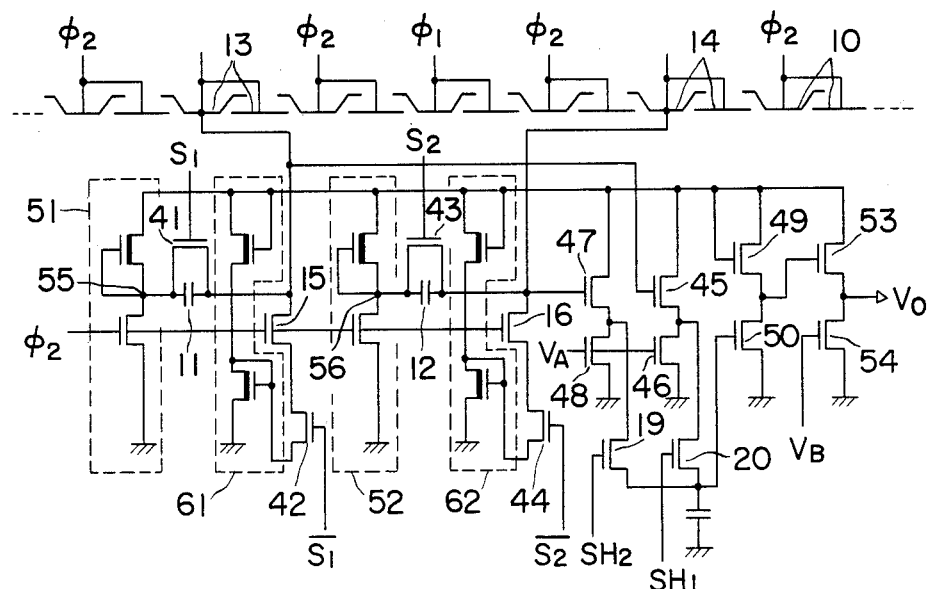
FIG. 10 is a circuit diagram in which the circuit shown in FIG. 7(a) is constituted with an actual transistor circuit.

FIG. 10 is a circuit diagram showing an example where the device in FIG. 7 is constituted with an actual transistor circuit. In this example, FETs of which gate portions are indicated by solid lines denote depletion type transistors and the remaining FETs denote enhancement type transistors. Since input contacts 55 and 56 of the step-up capacitors 11 and 12 serve as output contacts of inverters 51 and 52, respectively, a signal which is 180 out of phase of $\phi_2$, i.e., the clock $\phi_1$ is delivered. Thus, clocks $\bar{\phi}$ and $\phi$ in FIG. 7 correspond to $\phi_1$ and $\phi_2$ in FIG. 10, respectively. The switches 15, 16, 41, 42, 43, 44, 19 and 20 in FIG. 7 correspond to MOSFETs 15, 16, 41, 42, 43, 44, 19 and 20 in FIG. 10, which are the same reference numerals as those of the switches, respectively. Constant voltage sources 61 and 62 in FIG. 7 correspond to the constant voltage sources 61 and 62 in FIG. 10, respectively. The output signal processing circuits 17 and 18 in FIG. 7 correspond to source followers constituted with MOSFETs 45 and 46, and 47 and 48 in FIG. 10, in which impedance conversion of an output signal is performed. The output signal 21 which has undergone sample-hold in FIG. 7 corresponds to a voltage V$_0$ which has passed an amplifier constituted with MOSFETs 49 and 50 to undergo impedance conversion by the source follower constituted with MOSFETs 53 and 54, thereafter to be output to the outside.

As just described above, by controlling the pulse S, a setting can be made such that only a necessary floating gate electrode or electrodes are in the charge detection mode and the remaining floating gate electrodes are in the charge transfer mode, thus making it possible to prevent an unnecessary signal from being mixed into the output signal processing circuit. Thus, since only a necessary detection signal is delivered to the signal processing circuit, there is no possibility that crosstalk occurs as in the conventional device.

It is possible to inversely change the orders of the switches 42 and 44, and switches 15 and 16 in FIGS. 7 and 10. In addition, it is also possible to constitute the switches 15 and 42 or the switches 16 and 44 as a unitary switch, thus making it possible to logically control them, respectively. For example, FIG. 11 is a circuit diagram showing a unitary switch comprising the switches 15 and 42, and FIG. 12 shows an operational function Table. By controlling a switch 110 using a pulse $\bar{S}_1\phi$ in a manner stated above, the switches 15 and 42 in FIG. 7 can be replaced with the single switch 110.

It has been described in the above-mentioned embodiments that transfer is carried out using the two-phase clock. In addition, the present invention is also applicable to the transfer using a single phase clock. FIG. 13 shows an embodiment where the present invention is applied to the single phase CTD. In the single phase CTD, the transfer is carried out under condition where one of each electrode pair is held at an intermediate fixed potential V$_M$ and a pulse $\phi$ is applied to the other. To this end, a reference power source 111 is connected to a read electrode 113 through a switch 112 and the switch 112 is controlled by a timing pulse S+$\bar{S}\phi$ having an operational function as shown in FIG. 14. When the switch 112 is in on state, a voltage V$_H$ which takes an intermediate level with respect to the transfer pulse $\phi$ is delivered from the reference power source 111 to the electrode 113. Thus, the electrode 113 serves as solely the transfer electrode. In contrast, when the switch 112 is in off state, the electrode 113 is in floating condition. Thus, it functions as a detection electrode for detecting charges transferred from the preceding stage thereof to deliver a detection signal to the output circuit 8.

The present invention is not limited to devices provided with two read electrodes as in the above-mentioned embodiments, but is applicable to devices generally provided with single or a plurality of read electrodes to selectively detect charges therefrom. In addition, the present invention is also applicable to devices to take out an arbitrary number of outputs from a plurality of electrodes to apply various operations thereto. When a selection is made such that non-selected electrodes are in the transfer mode, there is no possibility of occurrence of crosstalk due to signal components unnecessary for a detection signal from a selected electrode.

As apparent from the foregoing description, a charge transfer device provided with a charge detection circuit according to the present invention is constituted to select either of the charge detection mode and the charge transfer mode, thus allowing the read electrode to be operation in a selected mode. Thus, a crosstalk based on a signal obtained from the detection circuit can be suppressed.

What is claimed is:

1. A charge transfer device comprising:
    a charge transfer path;
    a plurality of transfer electrodes provided on said charge transfer path;
    a read electrode provided on said charge transfer path;
    clock means for delivering a clock signal to said transfer electrodes to effect transfer on said charge transfer path;
    detector means for detecting signal components of a charge below said read electrode without affecting a charge transferred on said charge transfer path;
    transfer means for delivering a predetermined signal to said read electrode, thus allowing a charge below said read electrode to be transferred; and
    selector means for allowing only either said detector means or said transfer means to be operative for said read electrode.

2. A charge transfer device as set forth in claim 1, wherein read electrodes are provided at a plurality of portions on said charge transfer path, detector means being provided for said respective read electrodes.

3. A charge transfer device as set forth in claim 1, wherein said detector means is provided detection circuit of the floating gate system.

4. A charge transfer device as set forth in claim 1, wherein said transfer means delivers a clock signal used in said clock means to said read electrode or electrodes.

5. A charge transfer device as set forth in claim 1, wherein said transfer means delivers a voltage signal of an intermediate level between high and low levels used in said clock means to said read electrode or electrodes.

* * * * *